(12) United States Patent
Wang et al.

(10) Patent No.: US 10,978,121 B2
(45) Date of Patent: Apr. 13, 2021

(54) VOLTAGE CONTROL MAGNETIC RANDOM STORAGE UNIT, MEMORY AND LOGIC DEVICE COMPOSED THEREBY

(71) Applicant: INSTITUTE OF SEMICONDUCTORS, CHINESE ACADEMY OF SCIENCES, Beijing (CN)

(72) Inventors: Kaiyou Wang, Beijing (CN); Meiyin Yang, Beijing (CN); Kaiming Cai, Beijing (CN)

(73) Assignee: INSTITUTE OF SEMICONDUCTORS, CHINESE ACADEMY OF SCIENCES, Beijing (CN)

( * ) Notice: Subject to any disclaimer, the term of this patent is extended or adjusted under 35 U.S.C. 154(b) by 129 days.

(21) Appl. No.: 16/472,117

(22) PCT Filed: Dec. 23, 2016

(86) PCT No.: PCT/CN2016/111726
§ 371 (c)(1),
(2) Date: Mar. 10, 2020

(87) PCT Pub. No.: WO2018/112889
PCT Pub. Date: Jun. 28, 2018

(65) Prior Publication Data
US 2020/0211609 A1     Jul. 2, 2020

(51) Int. Cl.
*G11C 11/00*          (2006.01)
*G11C 11/16*          (2006.01)
(Continued)

(52) U.S. Cl.
CPC ........ *G11C 11/161* (2013.01); *G11C 11/1673* (2013.01); *G11C 11/1675* (2013.01);
(Continued)

(58) Field of Classification Search
CPC ..................................................... G11C 11/00
(Continued)

(56) References Cited

U.S. PATENT DOCUMENTS

| 9,379,162 | B2 * | 6/2016 | Bandyopadhyay ... G11C 11/161 |
| 2003/0107849 | A1 | 6/2003 | Ikarashi |
| 2016/0141333 | A1 * | 5/2016 | Bandyopadhyay ... H01L 27/222 365/158 |

FOREIGN PATENT DOCUMENTS

| CN | 1308317 | 8/2001 |
| CN | 101814294 | 8/2010 |

(Continued)

OTHER PUBLICATIONS

Cai et al., "Electric field control of deterministic current-induced magnetization switching in a hybrid ferromagnetic/ferroelectric structure", Nature Materials, Apr. 30, 2016, 15 pages.
(Continued)

*Primary Examiner* — Harry W Byrne
(74) *Attorney, Agent, or Firm* — Hamre, Schumann, Mueller & Larson, P.C.

(57) ABSTRACT

A voltage controlled magnetic random memory unit, a memory, and a logic device thereof. The memory unit includes: a ferroelectric layer applied with a first positive or negative voltage to control a directional switching of magnetization; a spin-orbit coupling layer located above the ferroelectric layer and applied with a second voltage to produce a spin current in a direction perpendicular to the spin-orbit coupling layer; a first magnetic layer located above the spin-orbit coupling layer, wherein, the spin current induces a random up and down magnetic switching of the first magnetic layer. The spin current may induce a directional switching of the first magnetic layer in conjunction with the first voltage applied to the ferroelectric layer. The invention generates ferroelectric polarization by applying a
(Continued)

voltage to both ends of the ferroelectric layer, thereby generating a non-uniform spin-orbit coupling effect, which can modulate the direction in which the current induces the magnetic switching of the magnetic film.

10 Claims, 4 Drawing Sheets

(51) Int. Cl.
  *H01L 27/22*  (2006.01)
  *H01L 43/08*  (2006.01)
  *H01L 43/10*  (2006.01)
  *H01L 43/12*  (2006.01)
  *H03K 19/18*  (2006.01)

(52) U.S. Cl.
  CPC ........ *G11C 11/1697* (2013.01); *H01L 27/222* (2013.01); *H01L 43/08* (2013.01); *H01L 43/10* (2013.01); *H01L 43/12* (2013.01); *H03K 19/18* (2013.01)

(58) Field of Classification Search
  USPC .......................................................... 365/158
  See application file for complete search history.

(56) References Cited

FOREIGN PATENT DOCUMENTS

| | | |
|---|---|---|
| CN | 102593348 | 7/2012 |
| CN | 102683581 | 9/2012 |
| CN | 105374934 | 3/2016 |
| EP | 1085586 | 4/2005 |

OTHER PUBLICATIONS

First Chinese Office Action, issued in the corresponding Chinese patent application No. 201611213900.X, dated Sep. 3, 2018, 17 pages.

International Search Report, issued in the corresponding PCT application No. PCT/CN2016/111726, dated Sep. 27, 2017, 6 pages.

\* cited by examiner

VOLTAGE CONTROL MAGNETIC RANDOM STORAGE UNIT, MEMORY AND LOGIC DEVICE COMPOSED THEREBY

CROSS-REFERENCE TO RELATED APPLICATION

This application claims priority to Chinese Application No. 201611213900.X, filed on Dec. 23, 2016, entitled "VOLTAGE CONTROLLED MAGNETIC RANDOM MEMORY UNIT, MEMORY AND LOGIC DEVICE THEREOF," which is incorporated herein by reference in its entirety.

TECHNICAL FIELD

The present invention relates to the field of information technology and microelectronics, and further to a voltage controlled magnetic random memory unit, and a memory including the memory unit and a logic device thereof.

BACKGROUND

Information storage and processing technology is an important foundation for the development of contemporary information technology and plays a vital role in the advancement of human society. Magnetic memory has been widely used in the field of information storage with the advantages of non-volatile, storage stability and so on. However, the magnetic memory usually requires the assistance of an external applied magnetic field. This is not conducive to the integration of the memory device, and will restrict the further development of information technology. Controlling a switching of magnetization with an electric field for the information storage and processing is an urgent requirement in the information field.

In the magnetic tunnel junction, the spin transfer torque effect generated by the current and the magnetic material can realize the switching of the moment of the free layer magnetic layer. In this structure, information is written and read on one single channel, and thus reading and writing of information can affect each other. In addition to the spin transfer torque effect, the electrical writing can also be realized by the spin-orbit coupling effect. At this time, the writing current is in the lateral direction, and the reading of information is achieved in the perpendicular direction. The reading and writing of information are implemented on different channels, thus not affecting each other. However, the direction of magnetization cannot be controlled during the writing process.

SUMMARY OF THE DISCLOSURE

According to an aspect of the present invention, there is provided a voltage controlled magnetic random memory unit, comprising:

a ferroelectric layer applied with a first positive or negative voltage to control a directional switching of magnetization;

a spin-orbit coupling layer located above the ferroelectric layer and applied with a second voltage to produce a spin current in a direction perpendicular to the spin-orbit coupling layer;

a first magnetic layer located above the spin-orbit coupling layer, wherein the spin current induces a random magnetic switching of the first magnetic layer, and the spin current induces a directional magnetic switching of the first magnetic layer in conjunction with the first voltage applied to the ferroelectric layer.

Further, the direction of the first voltage applied to the ferroelectric layer is the same as or opposite to the direction of the second voltage or in the same plane.

Further, the spin-orbit coupling layer is projected onto the ferroelectric layer in a cross shape. A second voltage for current may be applied to one pair of opposite ends of the cross. The direction of the second voltage is the same as or opposite to the direction of the first voltage applied to the ferroelectric layer or in the same plane.

Further, the other pair of opposite ends of the cross perpendicular to the one pair of opposite ends in the cross acts as an output, and an anomalous Hall voltage is detected from the output.

Further, an non-magnetic intermediate layer, a second magnetic layer and an antiferromagnetic layer are located above the magnetic layer. The antiferromagnetic layer is connected with the output, and the resistance change, as output information, is detected from the output by means of the magnetoresistance effect.

According to another aspect of the present invention, there is provided a logic device comprising the above-described voltage controlled magnetic random memory unit for detecting the switching of the moment of the first magnetic layer by controlling a first voltage direction and a second voltage direction to implement an XOR gate logic.

According to still another aspect of the present invention, there is provided a logic device comprising a voltage controlled magnetic random memory unit as described above. Each voltage controlled magnetic random memory unit comprising an output for detecting a magnetic switching of a first magnetic layer. The outputs of the two voltage controlled magnetic random memory units are electrically connected. NOT, AND, NOR and NAND logics are achieved by controlling the respective first and second voltage directions in the two voltage controlled magnetic random memory units.

According to still another aspect of the present invention, there is provided a magnetoresistive device as an epitaxial structure formed by the voltage controlled magnetic random memory unit described above. The magnetoresistive device comprises a magnetic tunnel junction, a giant magnetoresistive device or an anisotropic tunnel magnetoresistive device.

According to still another aspect of the present invention, there is provided a magnetic random memory comprising an array of a plurality of the above-described voltage controlled magnetic random memory units. A first voltage and a second voltage are independently input to each of the voltage controlled magnetic random memory units. A detected magnetic switching of a first magnetic layer in each of the voltage controlled magnetic random memory units is output independently.

Further, when the information is read, the direction of the first voltage of the voltage controlled magnetic random memory unit is also steered.

The above described features and advantages of the present invention will be more apparent from the following embodiments accompanied with drawings.

DETAILED DESCRIPTION

Figure 1:
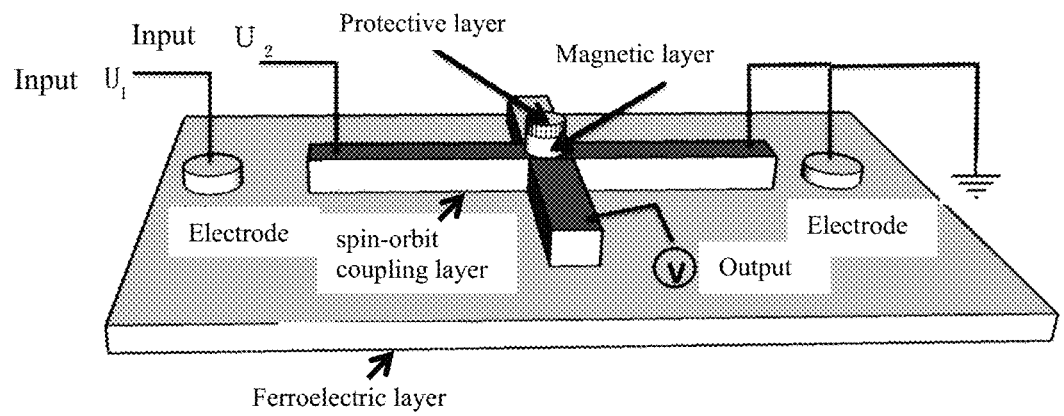
FIG. 1 is a schematic structural diagram of a voltage controlled magnetic random memory unit according to an embodiment of the present invention.

In order to make the objects, technical solutions and advantages of the present invention more apparent, the present invention will be further described in detail below in conjunction with the specific embodiments with reference to drawings. For the sake of clarity, the components in the drawings may not be depicted to scale. In addition, some components may be omitted from the drawings. It is contemplated that components and features in one embodiment may be beneficially incorporated in another embodiment without further elaboration.

The term "above" means incomplete and complete coverage in the perpendicular and/or lateral directions. For example, a spin-orbit coupling layer located above the ferroelectric layer means that the spin-orbit coupling layer may partially or completely cover the ferroelectric layer.

The basic concept of the present invention is to provide a magnetic random memory unit having a basic multilayer film structure: a ferroelectric layer/a strong spin-orbit coupling material layer/a ferromagnetic layer. Ferroelectric polarization is generated by applying a voltage across the ferroelectric layer. The ferroelectric polarization induces a perpendicular gradient electric field in the direction of the applied voltage at the interface of the ferroelectric layer and the spin-orbit coupling film layer, and thus produces a non-uniform spin-orbit coupling effect which may modulate the magnetic direction of the ferromagnetic.

Figure 2:
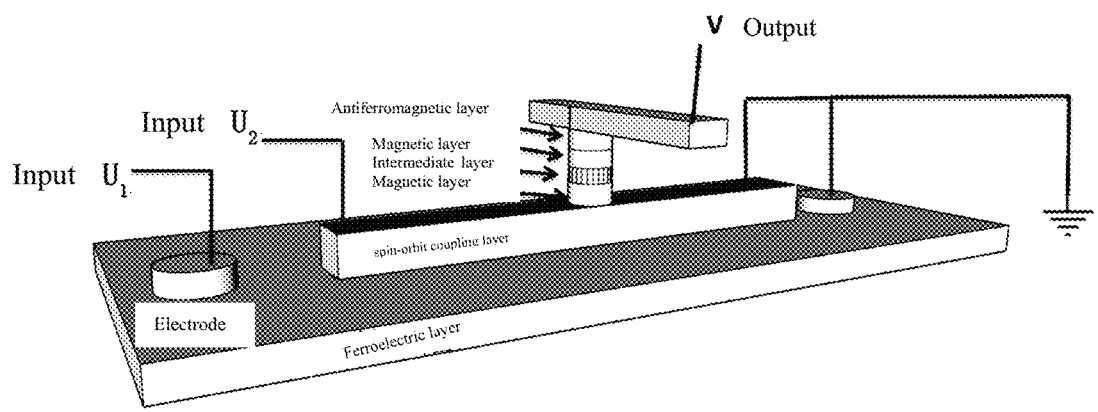
FIG. 2 is a schematic structural diagram of another voltage controlled magnetic random memory unit according to an embodiment of the present invention.

The film layer stacking manner in at least two structures can be extended from the film layer structure of the present invention according to different reading mode on the basis of the above-mentioned basic multilayer film structure. One structure is to read information by using an anomalous Hall Effect. Referring to FIG. 1, a ferroelectric layer, a spin-orbit coupling layer, a first magnetic layer, and a protective layer are sequentially grown upward. The other structure is to read information by using the magnetoresistance effect. Referring to FIG. 2, a ferroelectric layer, a spin-orbit coupling layer, a first magnetic layer, a non-magnetic intermediate layer, a second magnetic layer, an antiferromagnetic layer and a protective layer are sequentially grown upward. The above two modes only differ in the mode of reading. The first mode will be described in detail below, and those skilled in the art can apply the specific technical features and details of the first mode to the second mode respectively.

FIG. 1 is a schematic structural diagram of a voltage controlled magnetic random memory unit according to an embodiment of the present invention. A typical preparation method for the basic structure of the unit includes:

Step 1: a film of ferroelectric material with a certain thickness is epitaxially grown or spin-coated on a substrate.

The ferroelectric material may be a ferroelectric crystal material known in the prior art, preferably BTO (barium titanate, $BaTiO_3$), PZT (lead zirconate titanate, $Pb(Zr_{1-x}Ti_x)$, $0<x<1$), or PMN-PT (chemical formula $(1-x)[Pb(Mg_{1/3}Nb_{2/3})O_3] \cdot x[PbTiO_3]$), further preferably a PMN-PT crystal. For PMN-PT crystals, the ferroelectric material preferably has a thickness of 0.01-0.5 mm, and the preferable direction of growth of the PMT-PT is the (001) crystal plane for subsequent layer growth. The substrate should be chosen to match the lattice of the ferroelectric material to reduce internal stress and increase adhesion. The selected growth manner may be physical vapor deposition.

Step 2: The spin-orbit coupling layer, the first magnetic layer, and the protective layer are then sequentially grown.

The spin-orbit coupling can be chosen from non-magnetic materials with a strong spin-orbit coupling effect, such as Pt or Ta, preferably prepared by magnetron sputtering. The spin-orbit coupling layer can be a metal, topological insulator, or semiconductor material with a strong spin-orbit coupling, in which layer a current is passed, and a spin current is generated due to a strong spin-orbit coupling effect. The switching of the magnetic layer can be achieved by using this spin current.

Then, the first magnetic layer having perpendicular anisotropy is then grown, and the material of the first magnetic layer may be selected as CoNiCo and may be grown by sputtering. The first magnetic layer comprises a magnetic metal, an alloy and magnetic metal multilayer film, a magnetic semiconductor, and the like, all of which have ferromagnetic materials and have perpendicular magnetic anisotropy.

Finally, a protective layer may be further grown on the first magnetic layer to protect the first ferromagnetic layer.

It should be noted that other growth processes in the structure for reading information with the magnetoresistance effect refer to step 1 and step 2, except that an non-magnetic intermediate layer, a second magnetic layer and an antiferromagnetic layer are further grown between the first magnetic layer and the protective layer.

Step 3: a memory unit structure is formed by etching.

The structure generated in step 2 is subjected to micro-machining. The entire thin film structure is etched to the substrate by ion beam etching. The film is etched into a square shape, and then the electrode of the ferroelectric layer is etched in the middle of the square (the direction of the positive and negative electrodes is preferably along [110] crystal orientation of the ferroelectric layer). A first voltage $U_1$ may be applied between the two electrodes. The ferroelectric material can be polarized by a voltage applied between the two electrodes to control the spin-orbit coupling effect of the ferroelectric layer and the strong spin-orbit coupling material layer. The direction in which a voltage is applied to the ferroelectric layer is adjustable, and the ferroelectric layer can be polarized at a horizontal or perpendicular plane or at other angles. The directional switching of the ferromagnetic layer can be controlled.

The voltage of the ferroelectric layer can change a direction of a magnetization switching induced by the spin-orbit coupling torque, achieving a controllable and programmable magnetization state change.

The cross structure of the device is further etched, and etched to the position between the ferroelectric layer and the spin-orbit coupling layer, so that the projection of the spin-orbit coupling layer on the ferroelectric layer has a "cross" structure. One pair of opposite ends of the "cross" is preferably disposed along the direction of connection of the positive and negative electrodes in the ferroelectric layer. A second voltage $U_2$ may be applied to the one pair of opposite ends. Another pair of opposite ends of the "cross" may be connected to an output. The output signal is obtained by detecting the corresponding anomalous Hall voltage.

In the last step, the first magnetic layer is etched, and a nano-scale magnetic unit is etched in the center of the cross structure. The device structure is as shown in FIG. 1. The overall memory unit structure is a symmetrical structure that reduces the Rashba effect in the system.

It should be noted that other micromachining processes in the structure for reading information through the magnetoresistance effect refer to step 3, except that the projection of the spin-orbit coupling layer on the ferroelectric layer has a "—" structure. Since it is not necessary to measure the corresponding anomalous Hall voltage, the other pair of opposite ends of the original cross may be omitted. Further, the non-magnetic intermediate layer, the second magnetic layer and the antiferromagnetic layer may have the same structure as the first magnetic layer (that is, the projections thereof on the ferroelectric layer coincide with each other). The output is connected on the antiferromagnetic layer.

According to the memory unit structure prepared as described above, corresponding information storage and reading may be performed. The specific principle lies in (still only explained in the first structure):

A second voltage $U_2$ pulse is applied to the cross electrode, and a current is generated in the cross channel. Since the current passes through the spin-orbit coupling layer, a spin current may be generated on its surface due to the spin Hall effect. The spin current diffuses into the upper magnetic layer, thereby changing the direction of the magnetic moment of the material in the magnetic layer. The direction of the magnetic moment may be measured with an anomalous Hall resistance, and the output signal may be read. However, at this time, the second voltage $U_2$ pulse cannot have a deterministic switching direction of the moment, that is, the magnetic moment may be upward or downward after the voltage pulse. When the ferroelectric layer is polarized with the first voltage $U_1$, a gradient electric field may be generated along the direction of the applied electric field at the interface between the ferroelectric substrate and the spin coupling material layer. The motion of the electrons in the gradient electric field is subjected to the spin-orbit coupling, so that gradient spin current density is formed in the gradient electric field in the direction of the electric field. This gradient spin current is superimposed with the spin Hall Effect, so that the upward and downward switching of the magnetic moment is not degenerated. And it induces a current induced directional switching of magnetization, so that information can be written.

In another aspect of an embodiment of the present invention, there is provided a logic device implemented using the above memory unit.

The realization of the function of the XOR gate logic: the voltages of the magnetic random memory unit are input in the two ends of the cross and the two ends of the ferroelectric layer, respectively corresponding to $U_2$ and $U_1$. The voltage $U_2$ is input at two ends of the cross to write the information. The positive voltage is 1 and the negative voltage is 0. The anomalous Hall voltage V at the other two ends of the cross is measured to read the information. The direction of up and down of the magnetic moments of the magnetic material may cause the Hall voltage to change, representing the high and low levels, i.e., 1 and 0, respectively, in practical applications. In the case where the ferroelectric layer is not applied with voltage, the input voltage $U_2$ cannot induce the directional switching of the magnetic moment, that is, the read signals are 0 and 1 at random. When a positive voltage $U_1$ is applied to the ferroelectric layer, the output is a low level 0 when $U_2$ is positive, and the output V is a high level 1 when $U_2$ is negative. When a negative voltage $U_1$ is applied to the ferroelectric layer, the output is a high level 1 when the second voltage $U_2$ is positive, and the output is a low level 0 when $U_2$ is negative. This performance is an XOR gate function, so an XOR gate can be implemented with a single device.

Figure 3:
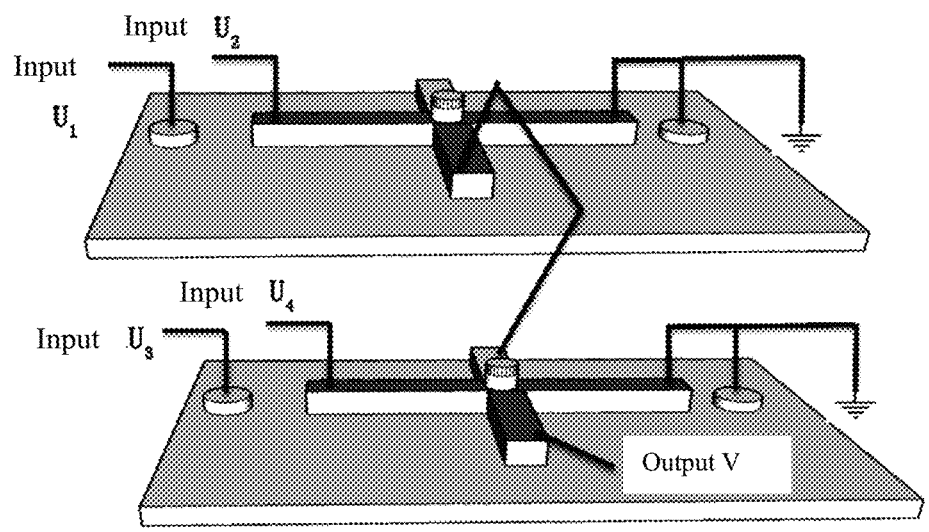
FIG. 3 is a schematic diagram of a programmable logic device, composed of two magnetic random memory units according to an embodiment of the present invention.

FIG. 3 is a schematic diagram of a programmable logic device composed of two magnetic random memory units according to an embodiment of the present invention.

A NOR gate or an AND gate can be implemented using the above two magnetic random memory units. NOR gate implementation: the two devices are arranged to connect as shown in FIG. 3, and the output is a series connection of the two magnetic random memory units. The ferroelectric layers $U_1$ and $U_3$ of the two magnetic random memory units are polarized with a positive voltage, which is 1 when the two units both output a high level, and otherwise 0. For example, when the second voltage $U_2$ and $U_4$ are input with 1, 1, both magnetic random memory units output a low voltage, so the final output is 0. When the second voltage $U_2$ and $U_4$ are input with 1, 0 or 0, 1, the two magnetic random memory units output a high level and a low level, or a low level and a high level, which are canceled by superposition, so the output is still 0. When the second voltage $U_2$ and $U_4$ are input with 0, 0, the two separate magnetic memory units both output a high level, which is still a high level by superposition, so the output is 1. This is a NOR gate function.

AND gate implementation: the first voltages $U_1$ and $U_3$ of the ferroelectric layer of the above two magnetic random memory units are polarized with a negative voltage, which is 1 when the two memory units both output a high level, and otherwise 0. For example, when the second voltage $U_2$ and $U_4$ are input with 1, 1, both of the two magnetic random memory units output a high voltage, so the final output is 1. When $U_2$ and $U_4$ are input with 1, 0 or 0, 1, the two magnetic random memory units output a high level and a low level, or a low level and a high level, which are canceled by superposition, so the output is still 0. When the second voltage $U_2$ and $U_4$ are input with 0, 0, both of the two magnetic random memory units output a low level, so the output is 0. This is a AND gate function.

The NOR gate and the NAND gate function can be implemented by the same two magnetic random memory units, that is, changing the voltage of the ferroelectric layer can realize conversion of two logic functions. This greatly improves the programmable nature of logic, improving computational efficiency and logic device density.

According to still another aspect of the embodiments of the present invention, there is provided a magnetoresistive device as an epitaxial structure formed by the magnetic random memory unit described above. The magnetoresistive device comprising a magnetic tunnel junction, a giant magnetoresistive device or an anisotropic tunnel magnetoresistive device.

Figure 4:
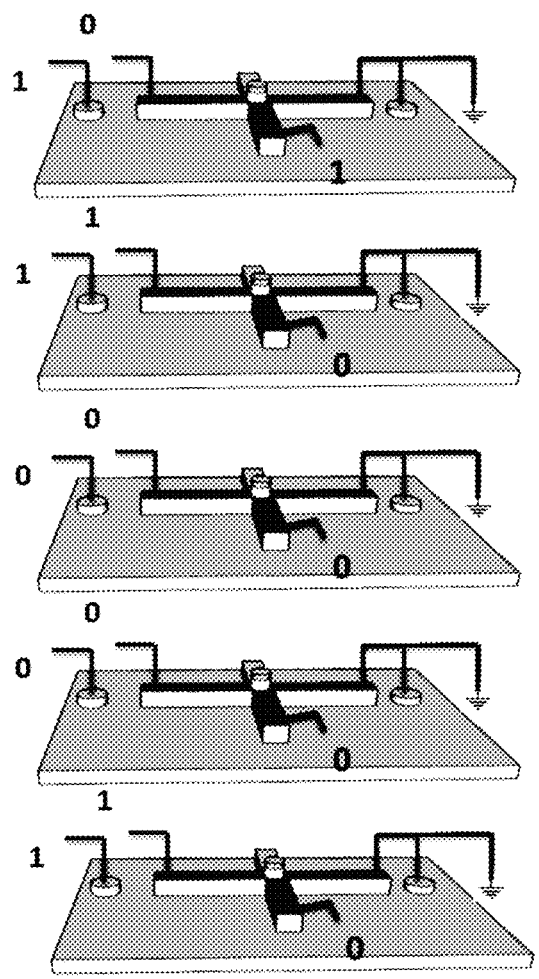
FIG. 4 is a schematic diagram of an encrypted magnetic random memory composed of a voltage controlled magnetic random memory unit according to an embodiment of the present invention.

According to still another aspect of the embodiments of the present invention, there is provided a magnetic random memory comprising an array of a plurality of the above-described magnetic random memory units. A first voltage and a second voltage are independently input to each of the magnetic random memory units. A detected magnetic switching of a first magnetic layer in each of the magnetic random memory units is output independently. An encrypted magnetic random memory can be realized by using a memory unit, and FIG. 4 shows a schematic diagram of an encrypted magnetic random memory. After applying a voltage to the ferroelectric layer, the magnetization direction can be changed by positive and negative currents to achieve the purpose of writing. It is defined that under the condition that a negative voltage is applied to the ferroelectric layer, i.e., the first voltage $U_1$=0, at this time, the unit changes to the state of 0 when the second voltage $U_2$ is input with 0, the unit changes to the state of 1 when the second voltage $U_2$ is input with 1. That is, when the input is 01001, the information written by the magnetic random memory is 01001, which is a general memory function. If the voltage of the ferroelectric layer is changed while the magnetic random memory unit is being written, for example, if voltage of the ferroelectric layer is 11001, then the written information is 10000 (that is, when the information is read, the direction of the first voltage of the magnetic random memory unit is also steered, and the real information can be read). This masks the real information 01001 and achieves the purpose of encryption. The real information can be only known from back-calculation of the voltage information of the ferroelectric layer. Thus, the voltage of the ferroelectric layer is equivalent to a key.

Figure 5:
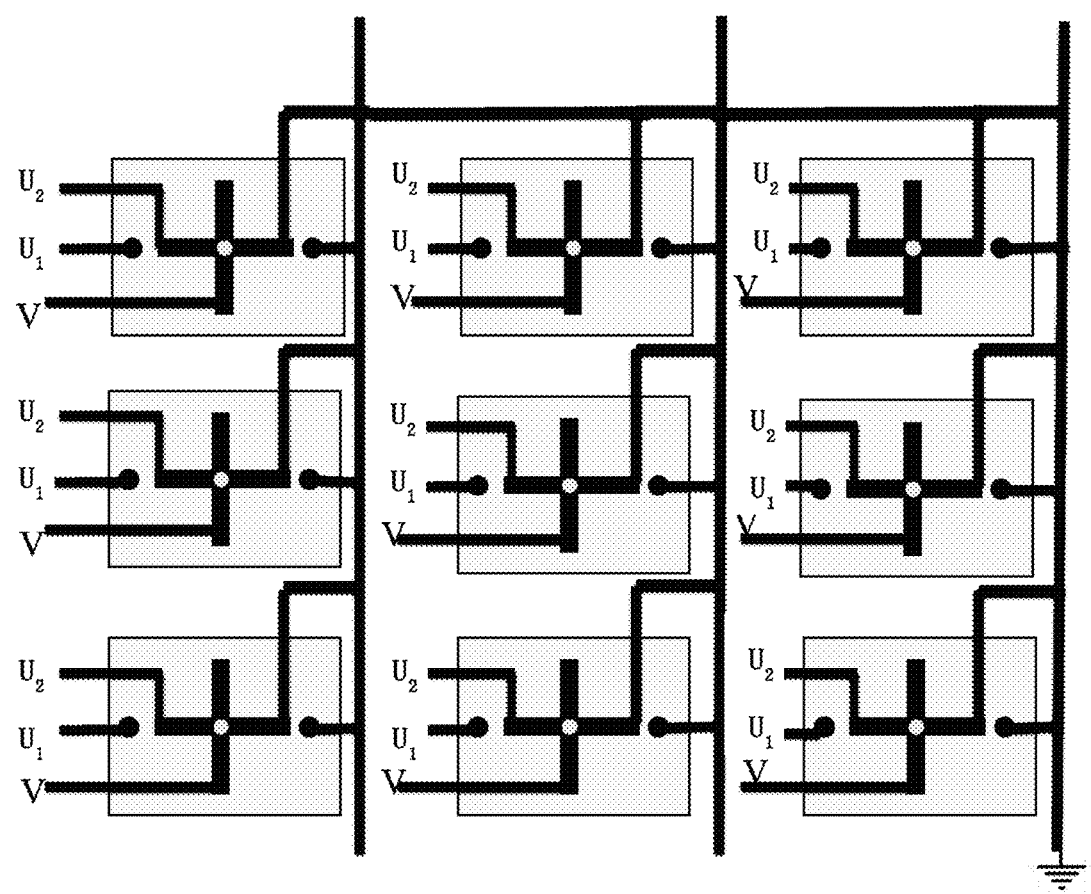
FIG. 5 is a schematic diagram of architecture of a magnetic random memory according to an embodiment of the present invention.

The architecture diagram of the magnetic random memory is shown in FIG. 5. In FIG. 5, the ferroelectric layer is divided into a plurality of unit blocks. Each unit block corresponds to an independent magnetic film structure. Each unit block can be independently applied with a voltage, e.g., the second voltage $U_2$ and the first voltage $U_1$, and each unit also outputs V independently. The non-encrypted storage may cause a negative voltage to be applied to the first voltage $U_1$ of each unit. The encrypted storage may apply a voltage in a different direction to the first voltage $U_1$ of each unit.

According to the above embodiments of the memory unit, the memory and the logic device, ferroelectric polarization is generated by applying a voltage across the ferroelectric layer. A perpendicular gradient electric field is formed in the direction of the applied voltage at the interface layer of the ferroelectric layer and the spin-orbit coupling film layer. A non-uniform spin-orbit coupling effect is produced and may modulate the direction in which the current induces the magnetic switching of the magnetic film. Also, the magnetic random memory unit is realized by the voltage controlled directional magnetization switching under the zero magnetic field at room temperature.

The purpose, technical solutions and advantageous effects of the invention have been described in detail in the above specific embodiments. It is to be understood that those are only specific embodiments but not intended to limit the present invention. Any modifications, equivalent substitutions, improvements, etc., made within the spirit and scope of the present invention are intended to be included within the scope of the present invention.

We claim:

1. A voltage controlled magnetic random memory unit, comprising:
   a ferroelectric layer applied with a first positive or negative voltage to control a directional switching of magnetization;
   a spin-orbit coupling layer located above the ferroelectric layer and applied with a second voltage to produce a spin current in a direction perpendicular to the spin-orbit coupling layer;
   a first magnetic layer located above the spin-orbit coupling layer, wherein the spin current induces a random magnetic switching of the first magnetic layer, and the spin current induces a directional switching of the first magnetic layer in conjunction with the first voltage applied to the ferroelectric layer.

2. The voltage controlled magnetic random memory unit according to claim 1, wherein the first voltage applied to the ferroelectric layer is in a same or opposite direction with the second voltage, or in the same plane with the second voltage, or the electric field induced by the applied first voltage has a component of a horizontal plane.

3. The voltage controlled magnetic random memory unit according to claim 1, wherein the spin-orbit coupling layer is projected on the ferroelectric layer in a cross shape, and one pair of opposite ends of the cross is applied with a second voltage for current injection.

4. The voltage controlled magnetic random memory unit according to claim 3, wherein another pair of opposite ends perpendicular to the one pair in the cross are output, and an anomalous Hall voltage is detected from the output to output signals.

5. The voltage controlled magnetic random memory unit according to claim 1, further comprising a non-magnetic intermediate layer, a second magnetic layer and an antiferromagnetic layer located above the magnetic layer, wherein the antiferromagnetic layer is connected with the output, and a resistance change, as output information, is detected from the output by means of magnetoresistance effect.

6. A logic device comprising the voltage controlled magnetic random memory unit according to claim 1, a switching of a first magnetic moment is detected by controlling a first voltage direction and a second voltage direction to implement an XOR gate logic.

7. A logic device comprising the voltage controlled magnetic random memory unit according to claim 1, wherein each voltage controlled magnetic random memory unit comprises an output for detecting a magnetic switching of a first magnetic layer, outputs of two voltage controlled magnetic random memory units are electrically connected, and NOT, AND, NOR and NAND logics are achieved by controlling respective first and second voltage directions in the two voltage controlled magnetic random memory units.

8. A magnetoresistive device applying an epitaxial structure formed by the voltage controlled magnetic random memory unit according to claim 1, wherein the magnetoresistive device comprises: a magnetic tunnel junction, a giant magnetoresistance device or an anisotropic tunnel magnetoresistive device.

9. A magnetic random memory comprising an array of the voltage controlled magnetic random memory unit according to claim 1, wherein a first voltage and a second voltage are independently input to each of the voltage controlled magnetic random memory units, and a detected magnetic switching of a first magnetic layer in each of the voltage controlled magnetic random memory units is output independently.

10. A magnetic random memory according to claim 9, wherein when information is read, a direction of the first voltage of the voltage controlled magnetic random memory unit is also steered.

* * * * *